United States Patent
Mayes et al.

(10) Patent No.: US 7,741,735 B2
(45) Date of Patent: Jun. 22, 2010

(54) METHOD AND APPARATUS FOR GENERATING SHORT DURATION HIGH VOLTAGE ENERGY PULSES USING INTEGRATED GENERATORS AND ANTENNAE

(76) Inventors: Jonathan R. Mayes, P.O. Box 341149, Austin, TX (US) 78734; William J. Carey, 12978 NW. 90th St., Whitewater, KS (US) 67154

( * ) Notice: Subject to any disclaimer, the term of this patent is extended or adjusted under 35 U.S.C. 154(b) by 245 days.

(21) Appl. No.: 12/005,597

(22) Filed: Dec. 27, 2007

(65) Prior Publication Data
US 2008/0238210 A1      Oct. 2, 2008

Related U.S. Application Data

(63) Continuation of application No. 11/169,531, filed on Jun. 29, 2005, now Pat. No. 7,345,382.

(60) Provisional application No. 60/583,755, filed on Jun. 29, 2004.

(51) Int. Cl.
H03K 3/00    (2006.01)
H03K 3/64    (2006.01)
(52) U.S. Cl. .................................. 307/106; 307/110
(58) Field of Classification Search ............... 307/106, 307/108, 110
See application file for complete search history.

(56) References Cited

U.S. PATENT DOCUMENTS 5,311,067 A * 5/1994 Grothaus et al. ............ 307/108
2002/0105773 A1 * 8/2002 Seely et al. .................. 361/263

* cited by examiner

Primary Examiner—Albert W Paladini
Assistant Examiner—Carlos Amaya
(74) Attorney, Agent, or Firm—David Allen Hall

(57) ABSTRACT

A method and a small profile apparatus for generating high voltage impulses. Integration of the radiating antenna with the impulse source structure makes possible the small size of the present invention.

5 Claims, 8 Drawing Sheets

METHOD AND APPARATUS FOR GENERATING SHORT DURATION HIGH VOLTAGE ENERGY PULSES USING INTEGRATED GENERATORS AND ANTENNAE This application is a Continuation of application Ser. No. 11/169,531 filed on Jun. 29, 2005 now U.S. Pat. No. 7,345,382 and claims priority from provisional application No. 60/583,755 filed on Jun. 29, 2004.

FIELD OF THE INVENTION

The present invention pertains to the field of electronic pulse generation.

BACKGROUND OF THE INVENTION

A typical high voltage impulse radiating system such as, but not limited to, a Marx generator requires a high voltage impulse and a separate antenna structure. The inherent bulk of such systems generally precludes portability and mobility, which are required features for applications other than basic research.

A Marx generator charges, with a power source, capacitors staged in parallel and then discharges them in series in order to radiate a temporally short burst of voltage the magnitude of which is higher than that of the source. Each stage incorporates a switch designed to close at a predetermined voltage. At closure, the capacitor stages add, or, in the commonly understood industry terminology, "erect," to form an overall capacitance that is equal to the individual stage capacitance divided by the number of stages, and the resultant output voltage is the individual stage voltage multiplied by the number of stages.

SUMMARY OF THE INVENTION

By integrating the impulse source structure and the radiating structure (the antenna), the present invention overcomes the typical impulse radiating system limitation and makes possible applications that require small size. The present invention uses the housing of a pulse generator as its radiating element or antenna

DETAILED DESCRIPTION OF THE PREFERRED EMBODIMENT

The present invention eliminates the typically separate antenna structure of an impulse radiating system by causing radiation to emanate from the generator housing. One embodiment of the present invention combines two Marx generators of opposite polarity into a dipole configuration that utilizes the housing structure of each generator as one arm of the combined system's antenna. This system is capable of delivering several cycles of RF energy. The resonant frequency, and hence the radiated frequency, is a function of the physical length of the complete device. In essence, the two Marx housings concurrently act as a dipole antenna. The radiating frequency may be changed by physically altering the length of the Marx generator housings.

Figure 1:
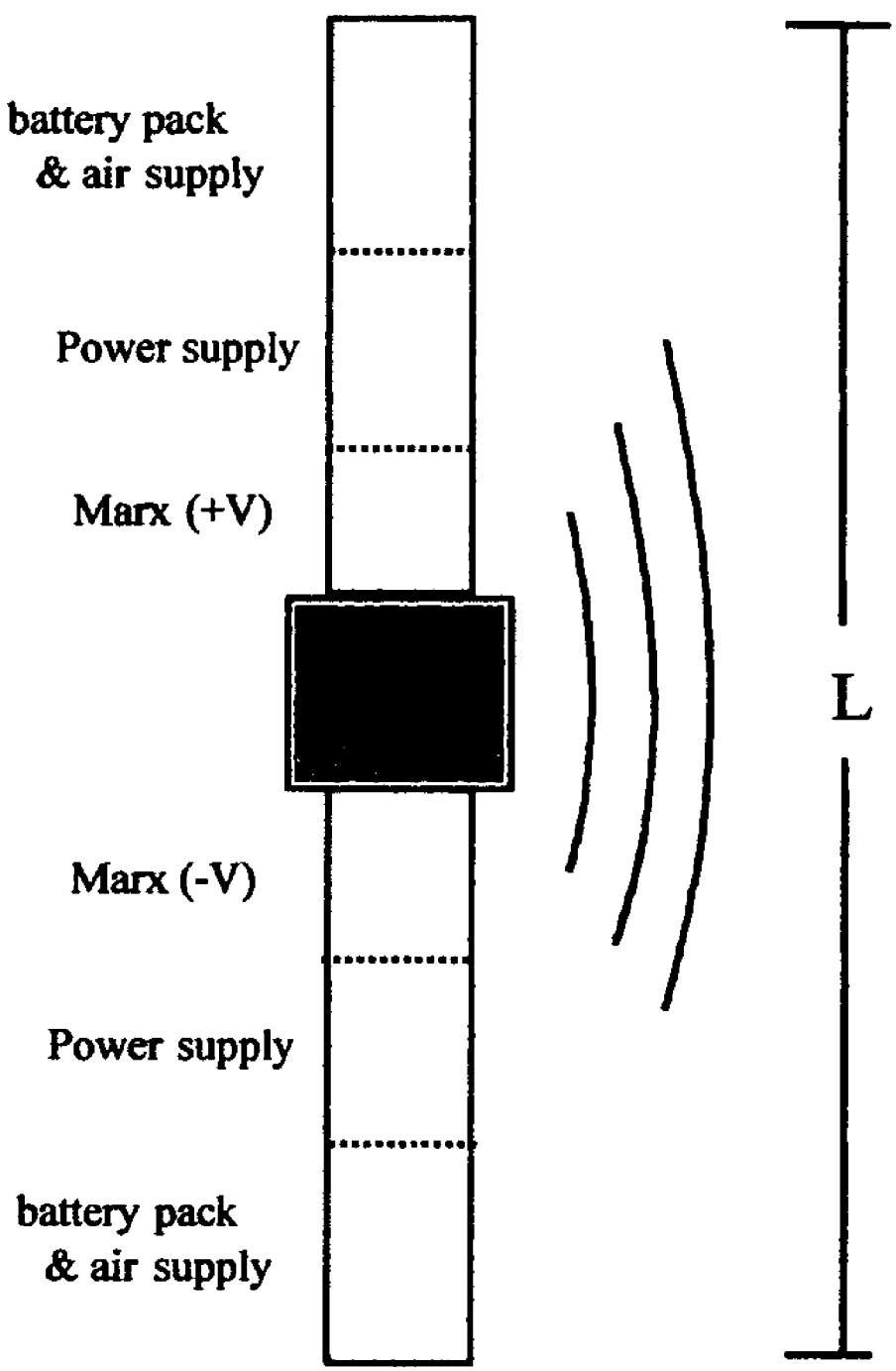
FIG. 1 is an external schematic of a Marx generator dipole antenna system.

The Max-dipole system is illustrated in FIG. 1. The two generators are collinearly placed with an electrically insulating layer separating their respective conductive housings. Located in this insulating layer is a switch or switches that provide synchronous triggering to both generators. The two generators erect (or fire) simultaneously with low pulse-to-pulse jitter, ensuring that the antenna resonates correctly.

Located in each arm of the dipole antenna is a Marx generator provisioned with external or internal power. The external housings of each generator are of equal length. Each generator is connected to its own housing, with no direct electrical connections being made to the opposite generator as the generator housings are isolated via an electrically insulating medium.

Figure 2:
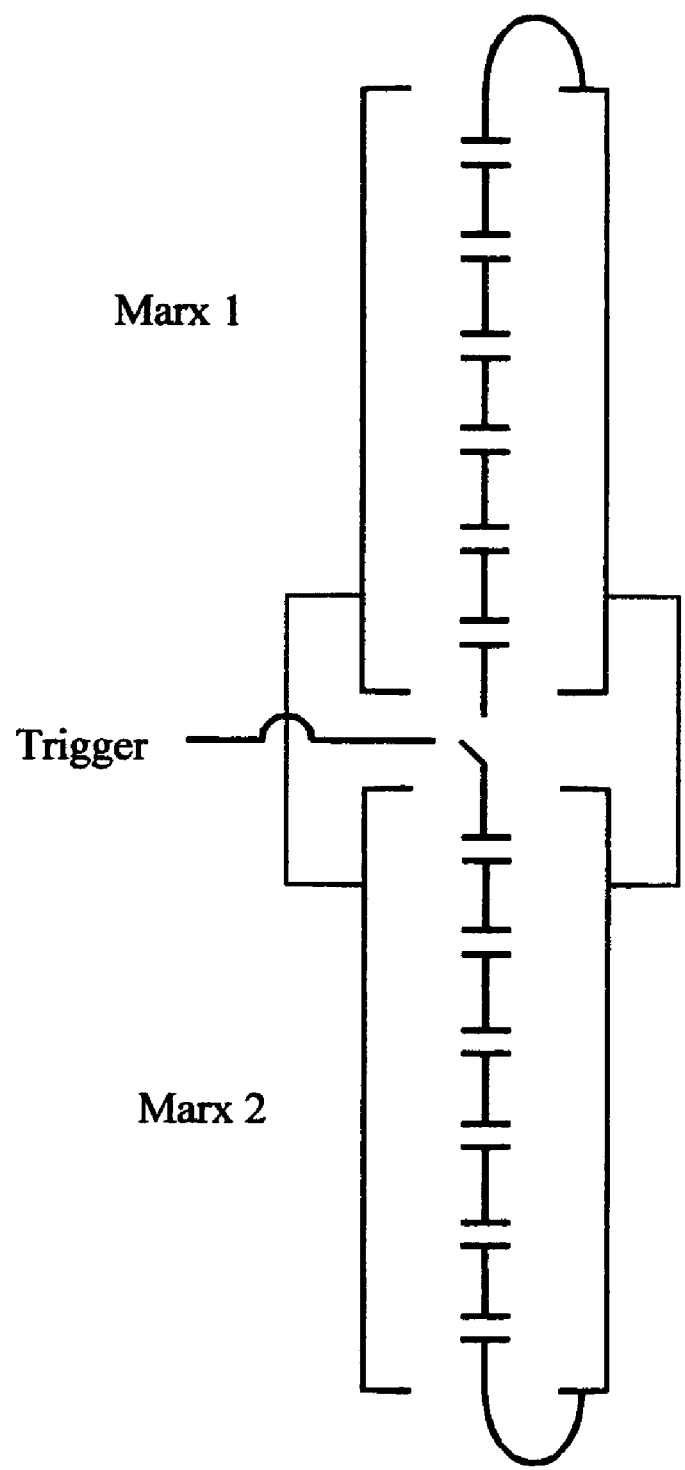
FIG. 2 is an internal schematic of a Marx generator dipole antenna system with a common trigger gap.

As shown in FIG. 2, the two Marx generators, charged with opposite polarities, are fired with a switch or switches that provide synchronous triggering and thus erect away from the center. The output of each generator is electrically connected to its housing. Therefore, the output current of each generator is propagated on the outer surface of the housing before encountering the open circuit at the end of the housing that is located at the center of the overall structure. Because the housings are not connected, the energy from each generator rings between the generator's bank of capacitors and the open circuit. As a result, RF energy radiates as a function of the combined housing structure length.

The two Marx generator housings are physically separated and electrically insulated from each other as shown in FIG. 1. As the Marx generator fires, its current shorts to its housing and propagates the length of the housing and thus emanates RF radiation. The current propagates along the housing until it encounters an open circuit at the insulated termination point of the housing. Then the current is reflected back into the Marx generator whereupon it is discharged a second time. This process repeats and thereby creates a ring down of the Marx generator energy. Because the two Marx generators are identical in construction, opposite in voltage polarity, and simultaneously triggered, the Marx generators ring down in concert. The two housings function in effect as a single antenna, as embodied by the dipole antenna shown in FIG. 1.

Figure 3:
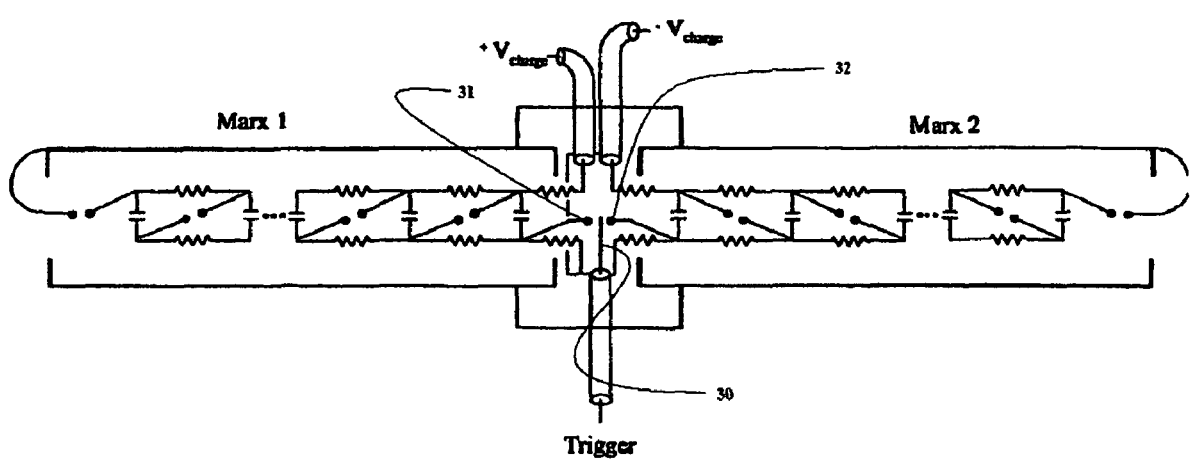
FIG. 3 is a circuit schematic of a Marx generator dipole antenna system with a common trigger gap.

The circuit schematic of the disclosed Marx-dipole system embodiment is shown in FIG. 3. The two Marx generators are charged with opposite-polarity high voltage power supplies. The generators' firing switch (switches), in this case, is (are) a commonly understood field distortion triggered spark gap. With the delivery of a high voltage pulse from the trigger source 30, the trigger gap between electrodes 31 and 32 breaks down and the two Marx generators simultaneously erect.

Figure 4:
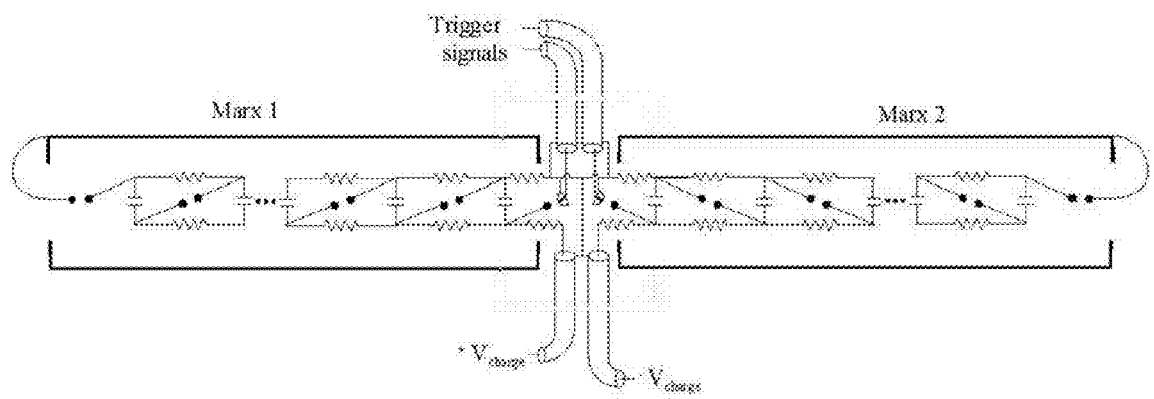
FIG. 4 is a circuit schematic of a Marx generator dipole antenna system with two independent trigger gaps.

A conventional triggering method employs multiple trigatron spark gaps, as shown in FIG. 4. In this method, each generator is triggered with its own trigger, and the generators do not erect with simultaneity as consistent as do the generators of the present invention.

Figure 5:
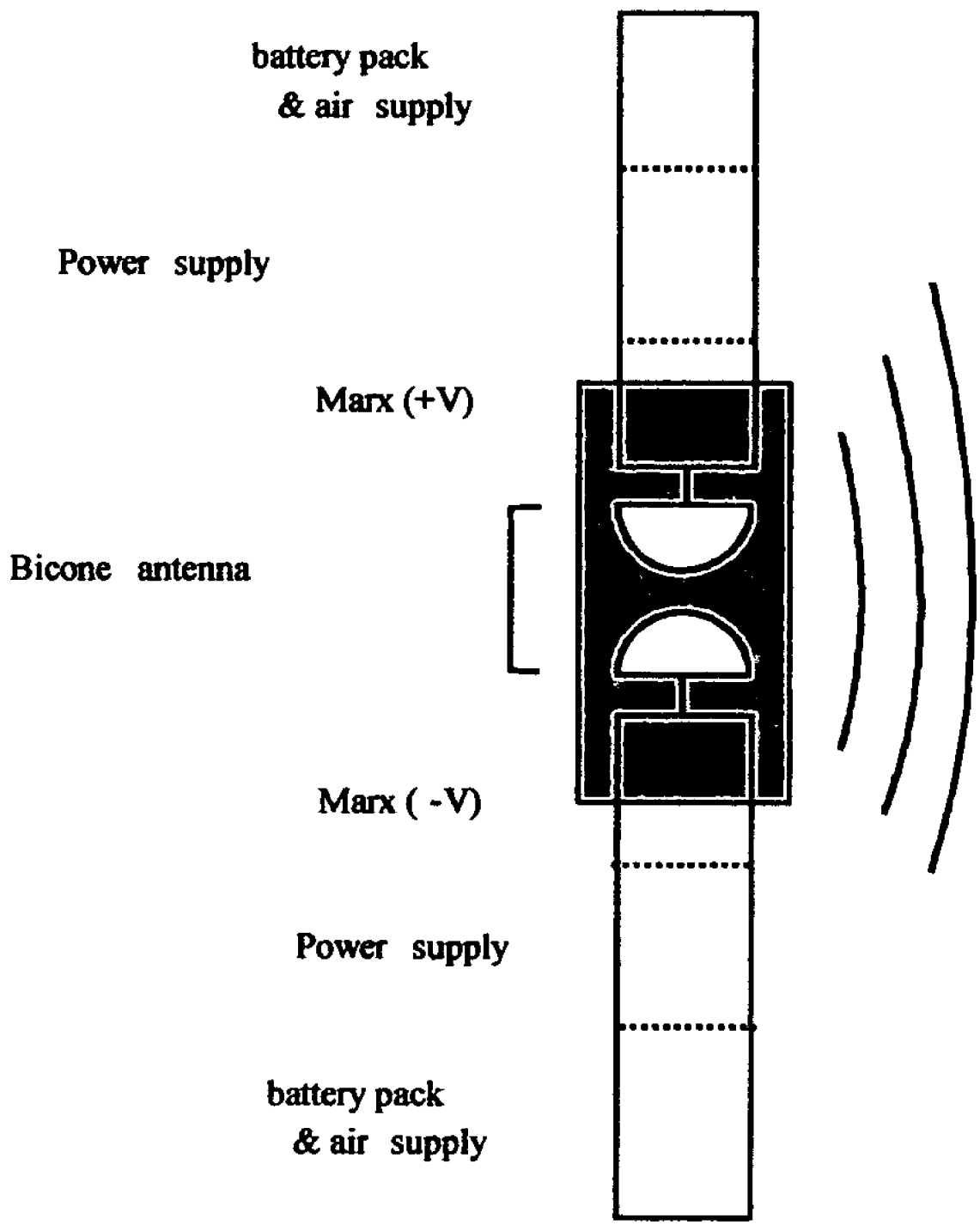
FIG. 5 is a schematic of a Marx generator system using two generators, each charging a conical antenna.

Another alternative embodiment of the present invention, a Marx-biconical system, is physically and operationally similar to the Marx-dipole system, differing in the method of radiation. Such an embodiment is illustrated in FIG. 5. The Marx-biconical system uses two generators of opposite polarity to pulse charge two cones that are electrically isolated from their respective housings. Upon reaching a predetermined charge amplitude, the gaseous gap between the cones breaks down, and RF energy is radiated. The cones can be three-dimensional TEM horn antennae offering efficient impedance matching with the free space medium.

Figure 6A:
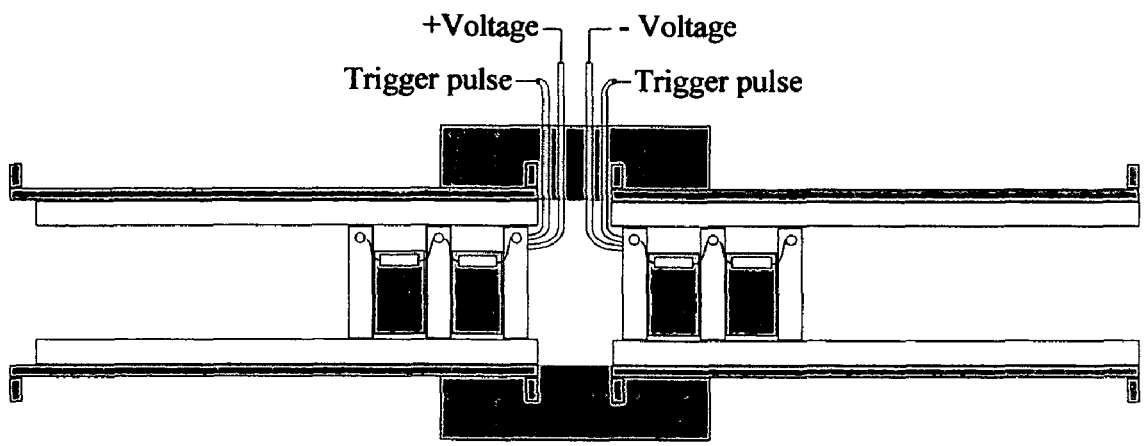
FIG. 6a is a longitudinal cross-sectional view of the preferred embodiment of a Marx stage.
Figure 6B:
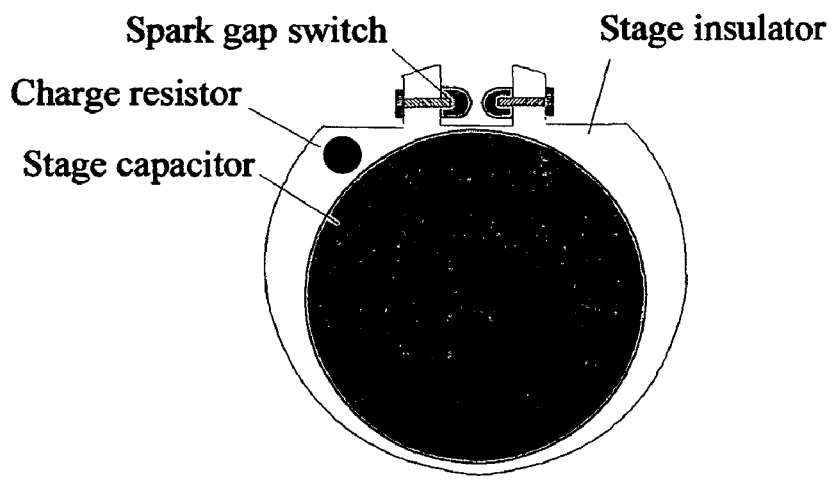
FIG. 6b is a transverse cross-sectional view of the preferred embodiment of a Marx stage.
Figure 7:
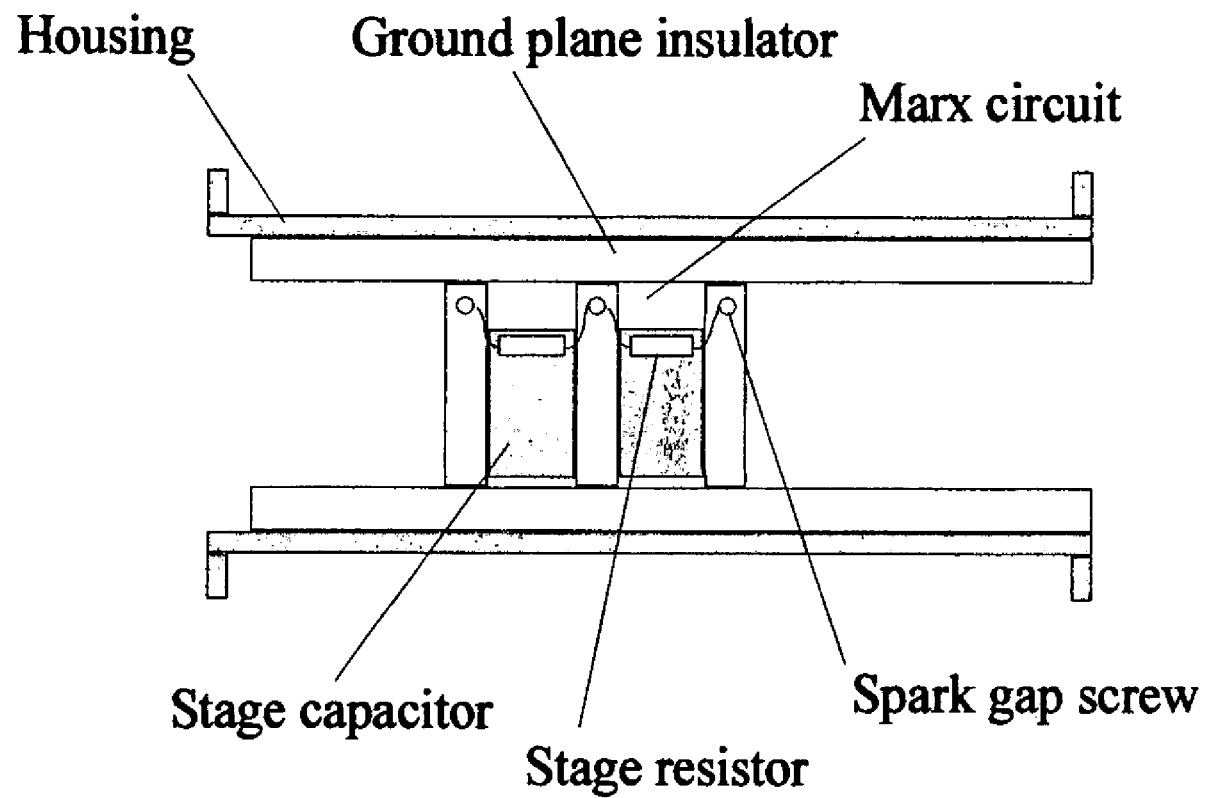
FIG. 7 is a side view of a Marx generator with a housing and a ground plane insulator.

The Marx circuit is compactly fabricated as described by the circuits of FIGS. 3 and 4, and illustrated in cross-sectional views FIGS. 6a and 6b. The side view FIG. 7 illustrates the housing, the ground plane insulator, and two Marx circuit stages. The housing structure is fabricated from aluminum tubing. The ground plane is fabricated from a plastic tube, such as acrylic or nylon. The capacitors used in the prototype come from TDK (UHV-6A), and charging resistors are standard carbon composition, 2 W, with values ranging from a few 10's of kilo-Ohms to a few Mega-Ohms. The DC high voltage and the high voltage trigger pulses are fed into the generator via RG-213 coaxial cable.

Figure 8:
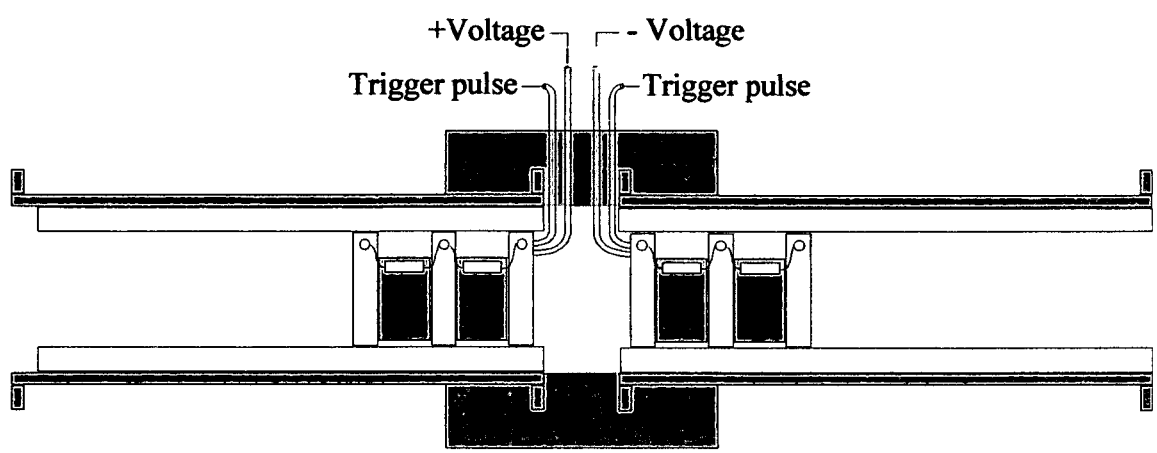
FIG. 8 is a side view of the co-joined generators and electrical feedthroughs.

The generators are co-joined, as illustrated in FIG. 8. An epoxy medium encapsulates several inches of each generator, for mechanical support, and the generator housings are separated by approximately 1 in.

In the preferred embodiment, the Marx generators are fabricated with the following characteristics:

| Parameter | Description | Value | Unit |
|---|---|---|---|
| $V_{open}$ | Open circuit voltage | 300 | kV |
| $V_{ch}$ | Maximum charge voltage | 30 | kV |
| N | Number of stages | 10 | |
| $N_{cap}$ | Number of capacitors per stage | 3 | |
| $C_{stage}$ | Capacitance per stage | 2.7 | nF |
| $C_{marx}$ | Erected capacitance | 270 | pF |
| $L_{marx}$ | Erected series inductance | 500 | nH |
| $Z_{marx}$ | Marx impedance | 43 | Ohm |
| $\eta_{volt}$ | Voltage efficiency (assmuning a 50 Ohm load) | 54 | % |
| $P_{power}$ | Peak power | 520 | MW |
| $E_{marx}$ | Energy stored in Marx | 12 | J |
| $L_{marx}$ | Marx length | 22 | in |
| $D_{marx}$ | Marx diameter | 5 | in |
| Wt | System weight | 30 | lbs |

Specifications, fabrication, and diagnostic testing of the Marx generator and similar generators are described in this present invention application and are described in the following references:

1. Matt B. Lara et al. A modular compact Marx generator design for the Gatlin Marx generator system. IEEE International Pulsed Power Conference Proceedings 2005. (Note: this paper documents development of APELC Marx generator, part number MG15-3C-940PF).

2. David A. Platts, "Gigawatt Marx Bank Pulser", *Ultra Wideband Radar*: Proceedings of the First Los Alamos Symposium, 1990, CRC Press.

3. M. G. Grothaus, S. L. Moran and L. W. Hardesty, "High Repetition Rate Hydrogen Marx Generator", Proc. of the 20th Power Modulator Symposium, June 1992, Myrtle Beach, S.C.

We claim:

1. A trigger, common to a first and a second pulse generator wherein said pulse generators are fired by a single common arc, said trigger comprising:
   a positively biased electrode communicating with said first pulse generator;
   a negatively biased electrode communicating with said second pulse generator;
   a gap between said electrodes; and
   a conductor situated in said gap such that when said conductor is fired by the application of an electrical pulse, the electrical field in said gap is distorted sufficiently for creation of an arc between said electrodes.

2. An apparatus as in claim 1 wherein at least one said pulse generator is a Marx generator.

3. An apparatus for radiating RF energy comprising:
   a first and a second Marx generator, said generators having opposite polarity electrodes;
   a gap between said electrodes;
   an electrically conductive first and second housing substantially enclosing said first and second generators, respectively;
   a conductor situated in said gap such that when said conductor is fired by the application of an electrical pulse, the electrical field in said gap is distorted sufficiently for creation of an arc between said opposite polarity electrodes, said arc substantially simultaneously erecting said first and second Marx generators, whereupon said generators begin generating short duration high voltage RF energy pulses;
   between the output of said first generator and at least one of said housings, a first electrical connection through which first RF energy from said first generator is conducted and subsequently radiated from said housing connected to said first connection;
   between the output of said second generator and at least one of said housings, a second electrical connection through which second RF energy from said second generator is conducted and subsequently radiated from said second housing connected to said second connection; and
   an open circuit between said first and second housings in which said first and second RF energies are combined.

4. An apparatus as in claim 3 further comprising a first cone attached to the output of at least one of said generators.

5. An apparatus for radiating RF energy comprising:
   a first and a second Marx generator, said generators having opposite polarity electrodes;
   a gap between said electrodes;
   an electrically conductive first and second housing substantially enclosing said first and second generators, respectively;
   a conductor situated in said gap such that when said conductor is fired by the application of an electrical pulse, the electrical field in said gap is distorted sufficiently for creation of an arc between said opposite polarity electrodes, said arc substantially simultaneously erecting said first and second Marx generators, whereupon said generators begin generating short duration high voltage RF energy pulses;
   between the output of said first generator and said first housing, an electrical connection, through which first RF energy from said first generator is conducted and subsequently radiated from said first housing;
   between the output of said second generator and said second housing, an electrical connection through which second RF energy from said second generator is conducted and subsequently radiated from said second housing; and
   an open circuit between said first and second housings in which said first and second RF energies are combined.

* * * * *